(12) United States Patent
Do

(10) Patent No.: US 6,806,174 B2
(45) Date of Patent: Oct. 19, 2004

(54) SEMICONDUCTOR DEVICES AND METHODS FOR FABRICATING THE SAME

(75) Inventor: Ik Soo Do, Gyeonggi-do (KR)

(73) Assignee: ANAM Semiconductor, Inc., Seoul (KR)

(*) Notice: Subject to any disclaimer, the term of this patent is extended or adjusted under 35 U.S.C. 154(b) by 0 days.

(21) Appl. No.: 10/757,820

(22) Filed: Jan. 15, 2004

(65) Prior Publication Data

US 2004/0152291 A1 Aug. 5, 2004

(30) Foreign Application Priority Data

Jan. 30, 2003 (KR) .................................. 10-2003-6336

(51) Int. Cl.⁷ ........................ H01L 21/336; H01L 29/76
(52) U.S. Cl. ................... 438/589; 438/212; 438/243; 438/259; 438/270; 438/271; 257/330; 257/332; 257/334
(58) Field of Search ........................ 438/270, 271, 438/212, 259, 243, 589; 257/330, 332, 213; 148/DIG. 20, DIG. 50, DIG. 53

(56) References Cited

U.S. PATENT DOCUMENTS

| | | | |
|---|---|---|---|
| 4,455,740 A | 6/1984 | Iwai | 29/571 |
| 4,835,585 A | 5/1989 | Panousis | 357/23.4 |
| 5,108,938 A * | 4/1992 | Solomon | 438/212 |
| 5,378,655 A | 1/1995 | Hutchings et al. | 437/203 |
| 5,639,676 A * | 6/1997 | Hshieh et al. | 438/270 |
| 5,640,034 A * | 6/1997 | Malhi | 257/341 |
| 6,509,608 B1 * | 1/2003 | Hueting | 257/330 |
| 6,518,129 B2 * | 2/2003 | Hueting et al. | 438/270 |
| 6,586,800 B2 * | 7/2003 | Brown | 257/330 |
| 2001/0041407 A1 * | 11/2001 | Brown | 438/270 |
| 2003/0122163 A1 * | 7/2003 | Kitamura | 257/213 |
| 2004/0002222 A1 * | 1/2004 | Venkatraman | 438/710 |

FOREIGN PATENT DOCUMENTS

| JP | 06-097450 | 4/1994 |
|---|---|---|
| JP | 07-074352 | 3/1995 |

OTHER PUBLICATIONS

C. Bulucea et al., Trench DMOS Transistor Technology For High–Current (100 A Range) Switching, Solid State Electronic, vol. 34, No. 5, pp493–507, 1991.*

* cited by examiner

Primary Examiner—Matthew Smith
Assistant Examiner—Belur Keshavan
(74) Attorney, Agent, or Firm—Grossman & Flight, LLC

(57) ABSTRACT

Semiconductor devices and methods for fabrication the same are disclosed. An illustrated method of fabricating a semiconductor device comprises: forming a trench on a substrate; forming a gate electrode by depositing and planarizing an oxide layer and polysilicon on the substrate including the trench; forming a gate oxide layer and a polysilicon layer on the substrate; forming source/drain regions by a photo process; and forming a contact plug on at least one of the source/drain regions. By controlling the overlap between the gate and the source/drain regions using a source/drain mask, current control becomes easy and a device sensitive to current control is easily fabricated. Sufficient spaces between the gate and the contact(s) due to the buried type gate make the fabrication processes easy.

13 Claims, 5 Drawing Sheets

SEMICONDUCTOR DEVICES AND METHODS FOR FABRICATING THE SAME

FIELD OF THE DISCLOSURE

The present disclosure relates generally to semiconductor devices and, more particularly, to methods for fabricating semiconductor devices.

BACKGROUND

In general, semiconductor devices may be divided into transistors, bipolar ICs (Integrated Circuits), and MOS ICs. A MOS (Metal Oxide Semiconductor) transistor is a type of field effect transistor. MOS transistors have the following structure: a source/drain region formed in a semiconductor substrate and a gate oxide layer and a gate formed on the substrate in which the source/drain region is formed. MOS transistors which have a LDD (Lightly Doped Drain) region inside the source/drain region are widely used.

MOS transistors may be further divided into N channel MOS transistors and P channel MOS transistors based on the type of channel in the device. A device with an N channel transistor and a P channel transistor formed on one substrate is called a CMOS (Complementary Metal Oxide Semiconductor) transistor.

A prior art method of fabricating a conventional semiconductor device will now be explained with reference to FIG. 1a through FIG. 1d.

In the example of FIG. 1a, an active region for a semiconductor device is defined with the formation of an STI (Shallow Trench Isolation) on a silicon wafer 1. Selective ion implantation of P-channel and N-channel dopants into the defined active region forms an N well for the PMOS region and a P well for the NMOS region, respectively. Then, after a gate oxide layer 3 is formed by thermal oxidation of the silicon wafer 1, polysilicon 4 is deposited on the layer by CVD (chemical vapor deposition).

The resistance of the polysilicon 4 is decreased by annealing after doping the P-channel dopant into the polysilicon of the PMOS region and the N-channel dopant into the polysilicon of the NMOS region, respectively.

Then, the gate electrode of the semiconductor device is formed by patterning the polysilicon 4 and the gate oxide layer 3. The source/drain regions 5 with low concentration are formed by selective ion implantation of a P-channel dopant and an N-channel dopant with low concentration into the PMOS region and the NMOS region, respectively, with a mask of the gate electrode. Next, a nitride layer 6 is deposited on the entire surface of the silicon wafer 1.

As illustrated in FIG. 1b, the nitride layer 6 on the silicon wafer 1 is removed by blanket etching. Though the nitride layer is removed from the upper surface of the silicon wafer 1, it is not removed from the lateral walls of the gate electrodes 3 and 4, and, thus, forms spacers 6. Then, source/drain regions 5 with high concentration are formed by selective ion implantation of P-channel dopant and N-channel dopant with high concentration into the PMOS region and NMOS region, respectively, with the gate electrodes 3, 4 and the spacers 6 masked.

As illustrated in FIG. 1c, a PMD (Pre-Metal Dielectric) liner oxide layer 8 is formed. The PMD liner oxide layer 8 prevents defects in the silicon wafer and the semiconductor device and diffusion of alkali ions into the silicon wafer since such defects and diffusion are caused by the high moisture contents of BPSG (Borophosphosilicate Glass) and PSG (Phosphosilicate Glass) layers which are deposited as interlayer dielectric in succeeding processes.

An interlayer dielectric 9 such as a BPSG or PSG layer is deposited for insulation between the metal layer and the polysilicon (or source/drain region). The metal layer is formed to connect the electrode of semiconductor device in succeeding processes. The interlayer dielectric 9 is planarized by a CMP (Chemical Mechanical Polishing) process to achieve satisfactory step coverage of the silicon wafer.

As illustrated in FIG. 1d, a mask pattern is formed on the interlayer dielectric 9 to reveal the contact regions for the electrode connection of the semiconductor device. Then, the interlayer dielectric 9 revealed by the mask pattern is etched and removed. Since the revealed areas of the PMD liner oxide layer 8 are etched and removed, contact holes are formed to reveal the electrode regions (e.g., the gate electrodes and the source/drain regions) of the semiconductor device.

After the mask pattern remaining on the interlayer dielectric 9 is removed, a thin metallic film is deposited on the entire surface of the silicon wafer 1 by using sputtering to fill the contact holes with the thin metallic film. Then, as the thin metallic film on the dielectric is patterned, a metal wiring layer is formed. Finally, the semiconductor device is completed.

As miniaturization of semiconductor devices leads to miniaturization of design rules, several problems are caused for the conventional fabrication of semiconductor devices when the contacts with the gate and source/drain regions are formed.

As shown in FIG. 1, a conventional gate structure has non-planarization weak points and also has a failure possibility created by a gate to contact short due to a lack of gate contact margin due to the miniaturzation of the device. Furthermore, it is difficult to form a fine gate pattern because current control is achieved by controlling the gate CD (critical dimension).

U.S. pat. No. 4,455,740 describes a method of forming a trench gate structure that achieves a size reduction of the transistor and makes the source and drain closer.

Japanese patent publication No. JP6097450 describes a top drain trench type RESURF (Reduced Surface Field) DMOS (Diffusion Metal Oxide Semiconductor) transistor that forms a trench between the source and the drain and establishes a gate inside the trench.

ISPSD 2000, pages 47–50, describes a trench gate structure that fills the inside of the trench with a polysilicon gate.

Japanese patent publication No. JP7074352 describes a transistor for horizontal electric power by forming the source, drain, and trench on the substrate, and forming a gate on the surface of the region which forms a channel between the source and the trench.

A structure and operation of a trench DMOS transistor is discussed in Bulucea et al., "Trench DMOS Transistor Technology for High Current Switch", 1991. Vol. 34, No. 5, pp. 493–507.

U.S. pat. No. 5,378,655 describes an erect gate structure for fabricating a trench gate power device.

Though such prior art efforts adopt a gate buried in a trench, creating a gate pattern is difficult in that the source/drain electrodes are both in the sides of a trench and that current control is achieved through the gate CD.

DETAILED DESCRIPTION

Figure 1A:
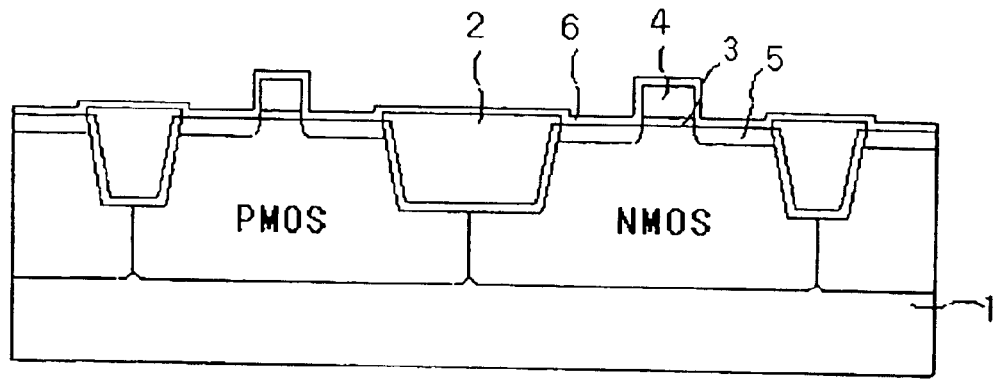
FIGS. 1a through 1d are cross-sectional views illustrating a conventional method of fabricating semiconductor devices.
Figure 1B:
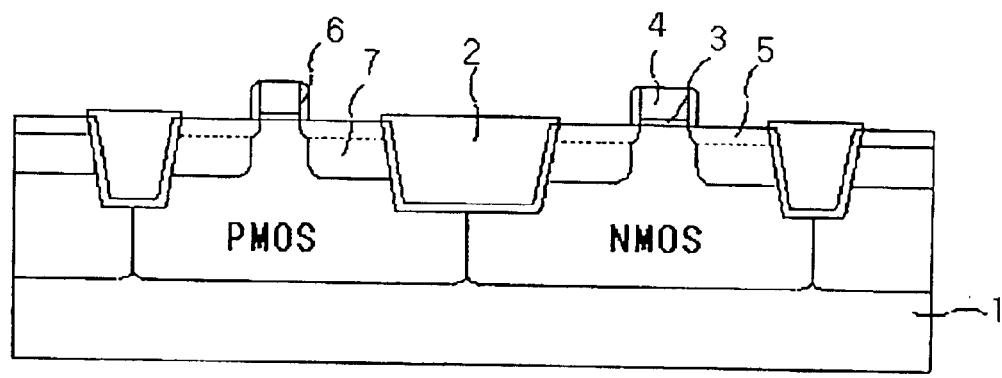
Figure 1C:
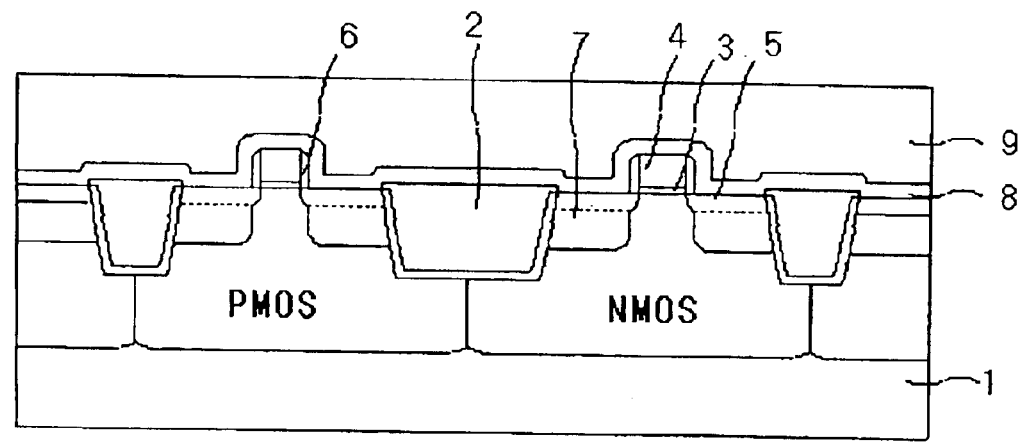
Figure 1D:
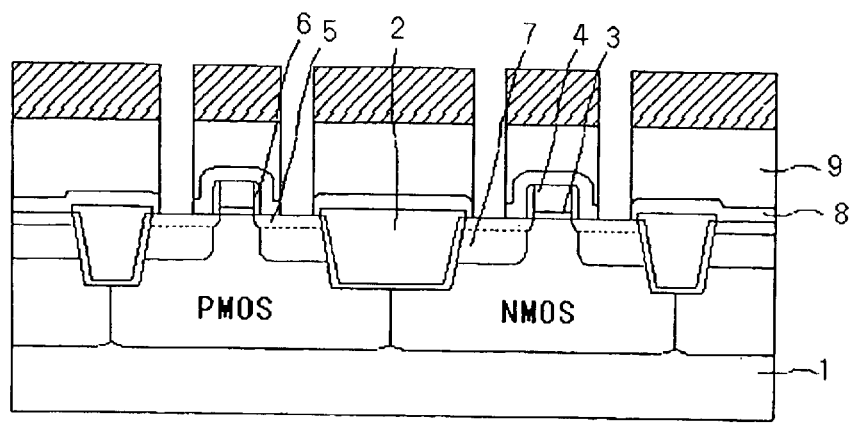
Figure 2A:
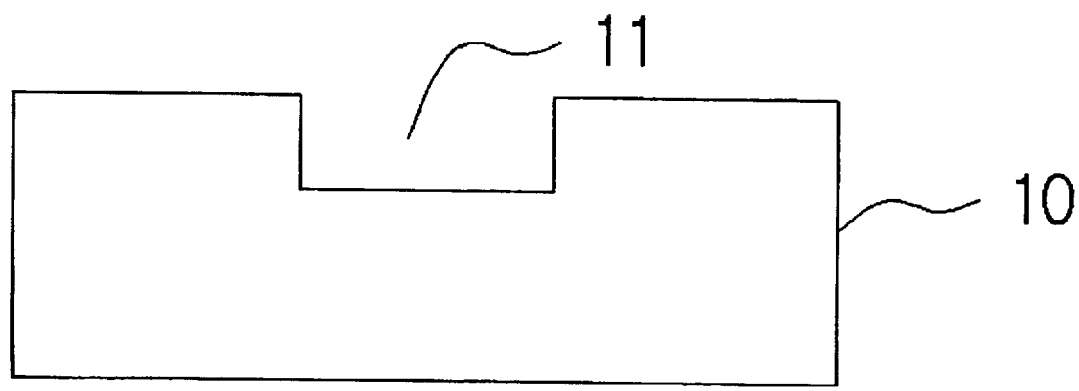
FIGS. 2a through 2f are cross-sectional views illustrating an example method of fabrication semiconductor devices in accordance with the teachings of this disclosure.

Referring to FIG. 2a, after cleaning a silicon wafer 10, a photoresist pattern is formed and a trench 11 is formed on the silicon wafer. Then, the photoresist pattern is removed.

More specifically, a photoresist layer is formed by spreading a photoresist material to be used as an etching mask on a substrate. A photoresist pattern is formed by patterning the photoresist layer to expose a trench region. Next, when the substrate is etched by using the photoresist pattern as an etching mask, a trench 11 is formed in the substrate.

In the illustrated example, the trench 11 is formed by an anisotropic etching process that uses $Cl_2$ and HBr as etching gas.

The photoresist pattern on the silicon wafer may be removed by a general method such as photoresist ashing.

Figure 2B:
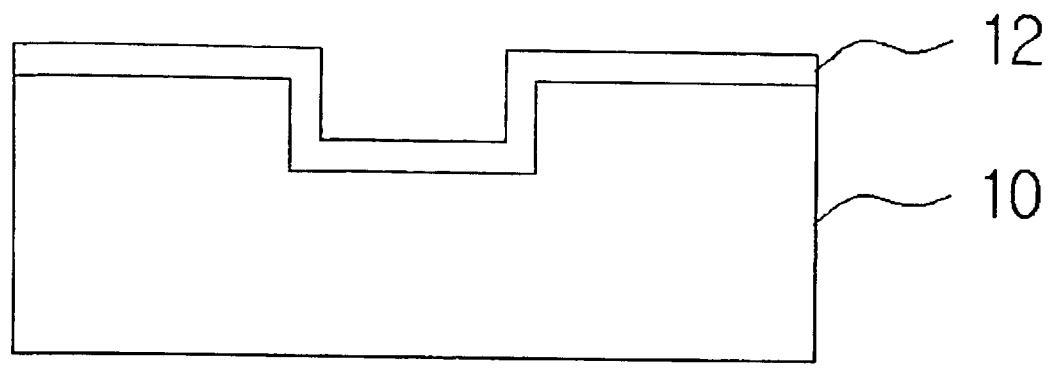

FIG. 2b is a cross sectional view of an oxide layer 12 deposited on the silicon wafer containing the trench. A USG (Undoped Silicate Glass) layer based on TEOS (Tetra-Ethyl Ortho Silicate Glass), an oxide layer formed by HDP CVD (High Density Plasma Chemical Vapor Deposition), or a USG layer formed at high temperature can be used as the oxide layer 12.

The oxide layer removes the defects of the silicon wafer resulting from the anisotropic etching process used to form the trench 11. The oxide layer also prevents leakage current through the trench surface by maintaining a stable bonding ($Si$–$O_2$ bonding) state for the silicon wafer. Further, the oxide layer plays a role in avoiding stress concentration by rounding the corner of the trench bottom.

Figure 2C:
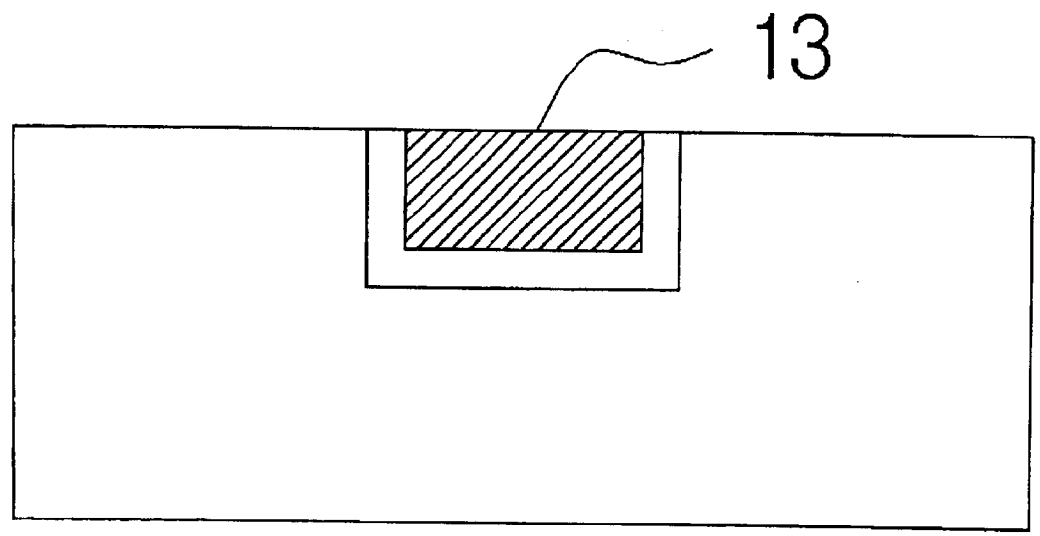

FIG. 2c is a cross sectional view of an example gate electrode 13 formed in the trench 11. The gate electrode 13 is formed as follows.

Polysilicon is deposited on the silicon substrate including the oxide layer 12 by LPCVD (low pressure chemical vapor deposition) at a temperature of about 420–520° C., (preferably at a temperature of about 470° C.), using $Si_2H_6$.

Deposition of polysilicon at a low temperature is important for the manufacture of a low current device. Another way to deposit the polysilicon is to use plasma chemical vapor deposition.

Gate electrode material is deposited on the oxide layer 12 inside the trench 11 to cover the trench 11 sufficiently. Impurities doped with polysilicon, silicide, or metal can be used as the gate electrode material.

After the polysilicon is formed, a CMP process is performed on the resulting structure until the surface of the silicon substrate 10 is exposed.

By forming a buried type gate according to the method described above, it is easy to planarize the gate.

Figure 2D:
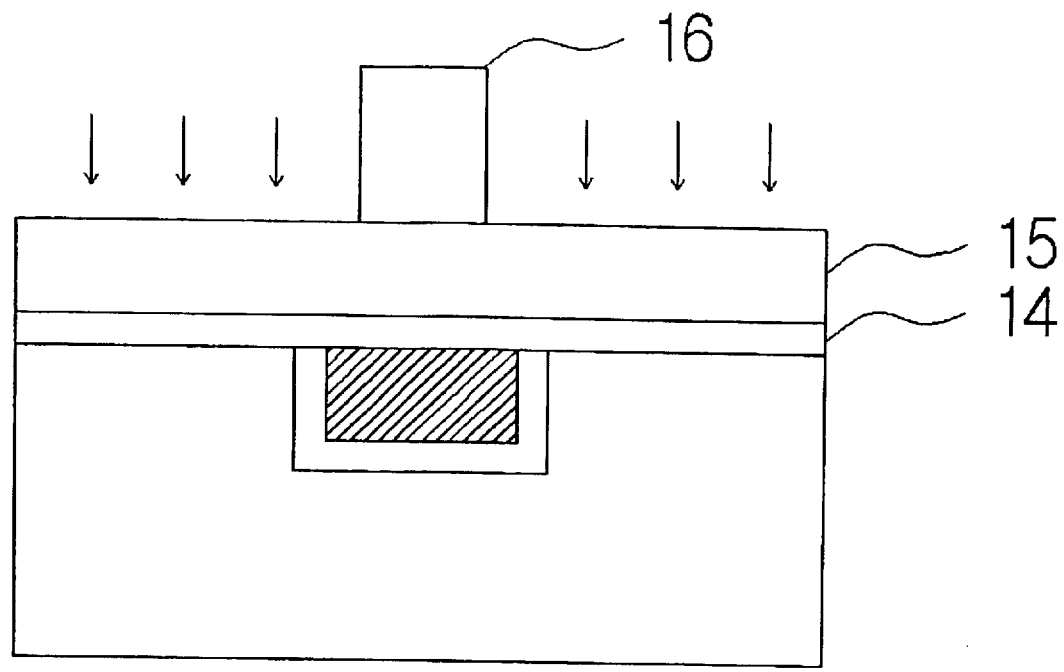

FIG. 2d illustrates forming and wiring an example source/drain. In particular, a gate oxide layer 14 is formed on the substrate 10 including the gate electrode 13. The gate oxide layer 14 is deposited and formed with a thickness of about 500 to 1000 Å by LPCVD or HDP CVD.

Then, after a polysilicon layer 15 is deposited on the gate oxide layer 14 by, for example, LPCVP, a photo process is performed to form source and drain regions, thereby forming a photoresist pattern 16 as a mask for an ion implantation. Next, impurities are ion-implanted, and the photoresist pattern is removed.

The polysilicon 15 is deposited by LPCVD at a temperature of about 420–520° C., (preferably at a temperature of about 470° C.), by using a $Si_2H_6$ gas.

Figure 2E:
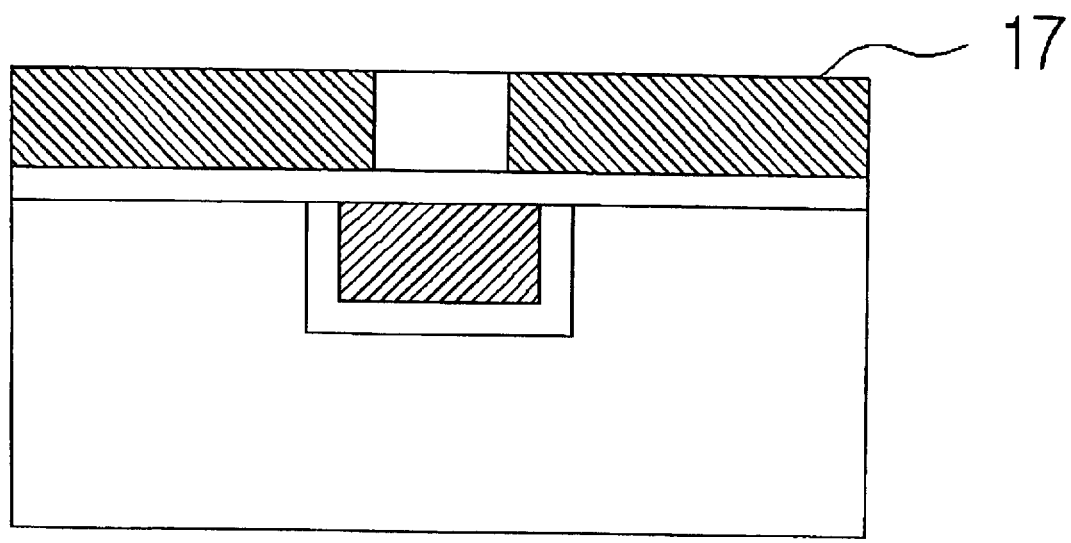

FIG. 2e is a cross sectional view of the semiconductor device with the source and the drain 17 formed.

By controlling the size of the photoresist pattern, overlap between the gate and the source/drain region can be controlled. Therefore, a device sensitive to current control can be fabricated.

Figure 2F:
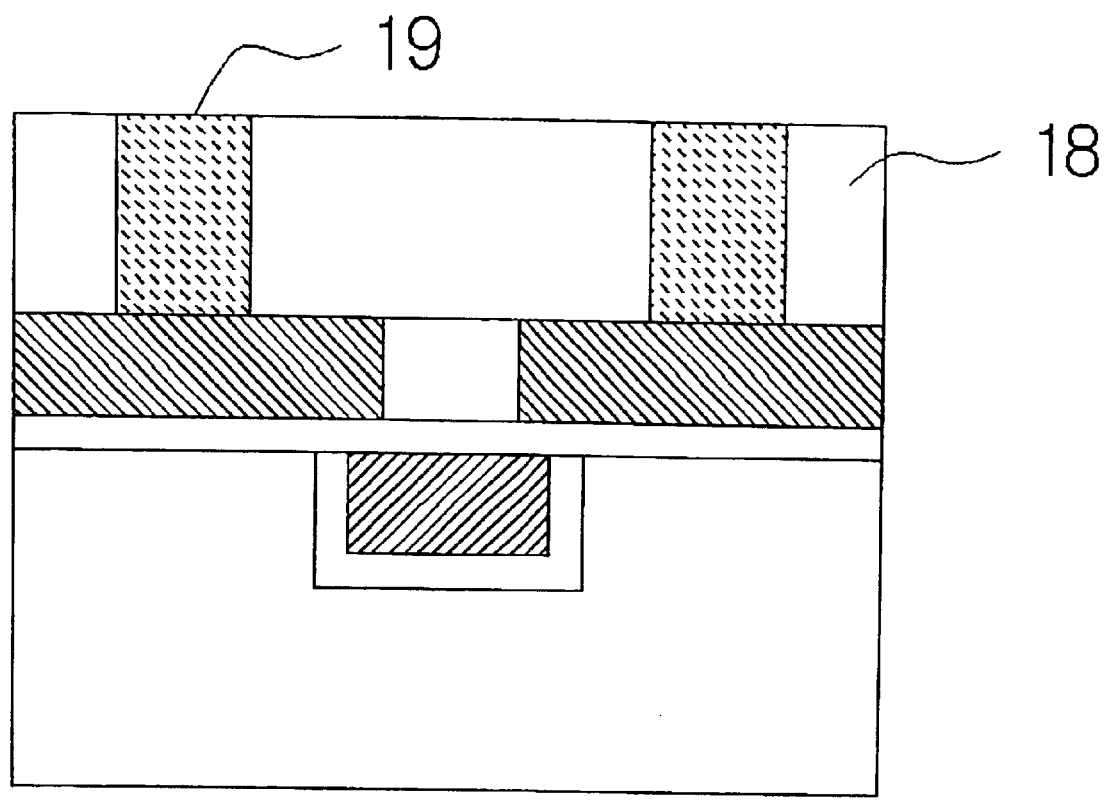

FIG. 2f is a cross sectional view of the semiconductor device with contact plugs 19 formed. The contact plugs 19 may be formed as follows.

In particular, an interlayer dielectric 18 is formed on the substrate including the source and the drain 17. A contact region is formed by a photo process. By depositing and planarizing a metal layer, the contact plugs 19 are formed. The interlayer dielectric 18 is deposited by LPCVD. A TEOS oxide layer and a BPSG may be used as the interlayer dielectric 18.

In other words, by etching the interlayer dielectric 18 by a photo process such that the source/drain regions are exposed, contact holes are formed. Next, by depositing and planarizing a metal layer, the contact plugs 19 are formed.

An example semiconductor device fabricated with the processes described above comprises a trench 11 on a predetermined region of a substrate 10, a gate electrode 13 buried inside the trench 11, a gate oxide layer 14 on the trench and the gate electrode 13, a polysilicon layer 15 on the gate oxide layer 14, a source/drain region 17 doped with impurities in predetermined regions of the polysilicon layer 15, an interlayer dielectric 18 on the polysilicon layer 15 and the source/drain region 17, and contact plugs 19 in the interlayer dielectric 18, the contact plugs being in contact with respective ones of the source/drain 17.

Thus, the example methods of fabrication discussed above form a buried type gate by using a trench, thereby achieving a planarization of a device. By controlling the overlap between the gate and the source/drain regions using a source/drain mask, current control becomes easy and a device which is sensitive to current control is easily fabricated. The sufficient spaces between the gate and contacts due to the buried type gate make the fabrication processes easy.

From the foregoing, persons of ordinary skill in the art will appreciate that example methods of fabricating semiconductor devices have been disclosed. A disclosed example makes the surface of a device planar and the space between the gate and the contact large enough to facilitate the manufacture of the device by forming a buried type gate by use of a trench. This affords a device sensitive to current control by controlling the current with the source/drain.

An illustrated method of fabricating a semiconductor device comprises: forming a trench in a substrate; forming a gate electrode by depositing and planarizing an oxide layer and a polysilicon layer on the substrate including the trench; sequentially forming a gate oxide layer and a polysilicon layer on the substrate; forming source/drain regions by using a photo process; and forming contact plugs on respective ones of the source/drain regions.

An illustrated semiconductor device comprises: a trench in a predetermined region of a substrate; a gate electrode buried inside the trench; a gate oxide layer on the trench and the gate electrode; a polysilicon layer on the gate oxide layer; source/drain regions doped with impurities in predetermined regions of the polysilicon layer; an interlayer dielectric on the polysilicon layer and the source/drain regions; and contact plugs in the interlayer dielectric in contact with corresponding ones of the source/drain.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a semiconductor device comprising:

forming a trench in a substrate;

forming a gate electrode by depositing and planarizing an oxide layer and polysilicon on the substrate including the trench;

forming a gate oxide layer and a polysilicon layer on the substrate and the gate electrode;

forming a source region and a drain region by a photo process; and forming a contact plug on at least one of the source region and the drain region.

2. A method as defined in claim 1, wherein forming the trench comprises performing anisotropic etching using $Cl_2$ and HBr as etching gas.

3. A method as defined in claim 1, wherein forming the gate electrode by depositing and planarizing the oxide layer and the polysilicon comprises forming the polysilicon by LPCVD.

4. A method as defined in claim 1, wherein forming the gate electrode by depositing and planarizing the oxide layer and the polysilicon comprises performing CMP until a surface of the substrate is exposed.

5. A method as defined in claim 1, wherein forming the gate oxide layer and the polysilicon layer on the substrate and the gate electrode comprises forming the polysilicon layer by LPCVD.

6. A method as defined in claims 5, wherein the LPCVD is performed at a temperature of about 420–520° C. using a $Si_2H_6$ gas.

7. A method as defined in claims 3, wherein the LPCVD is performed at a temperature of about 420–520° C. using a $Si_2H_6$ gas.

8. A method as defined in claim 1, wherein the gap between the source and the drain is controlled by a gap between photoresist patterns.

9. A method as defined in claim 1, wherein the gate oxide layer comprises a USG layer based on TEOS.

10. A method as defined in claim 1, wherein forming the gate oxide layer comprises performing HDP CVD.

11. A method as defined in 1, wherein the gate oxide layer comprises a USG layer formed at a high temperature.

12. A semiconductor device comprising:

a trench in a substrate;

a gate electrode buried inside the trench;

a gate oxide layer on the gate electrode;

a polysilicon layer on the gate oxide layer;

source and drain regions in the polysilicon layer;

an interlayer dielectric on the polysilicon layer; and a contact plug in the interlayer dielectric and contacting one of the source and the drain.

13. A semiconductor device as defined in claim 12, wherein the trench is formed by anisotropic etching using $Cl_2$ and HBr as etching gas.

* * * * *